United States Patent
Nozuyama

(10) Patent No.: US 7,392,146 B2
(45) Date of Patent: Jun. 24, 2008

(54) FAULT LIST AND TEST PATTERN GENERATING APPARATUS AND METHOD, FAULT LIST GENERATING AND FAULT COVERAGE CALCULATING APPARATUS AND METHOD

(75) Inventor: Yasuyuki Nozuyama, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/622,559

(22) Filed: Jan. 12, 2007

(65) Prior Publication Data

US 2007/0260408 A1   Nov. 8, 2007

(30) Foreign Application Priority Data

Jan. 12, 2006   (JP) ............................ P2006-004943

(51) Int. Cl.
*G01R 31/00* (2006.01)
*G01R 31/14* (2006.01)

(52) U.S. Cl. ...................................... 702/117
(58) Field of Classification Search .................. 702/58, 702/117, 118, 183, 185; 714/738, 742; 324/765
See application file for complete search history.

(56) References Cited

U.S. PATENT DOCUMENTS

| | | | |
|---|---|---|---|
| 2006/0005094 A1 | 1/2006 | Nozuyama | |
| 2006/0066339 A1* | 3/2006 | Rajski et al. | 324/765 |
| 2007/0013403 A1* | 1/2007 | Nozuyama | 324/765 |
| 2007/0201618 A1* | 8/2007 | Nozuyama | 379/14.01 |

FOREIGN PATENT DOCUMENTS

| | | |
|---|---|---|
| JP | 2003-107138 | 4/2003 |
| JP | 2006-010351 | 12/2006 |

OTHER PUBLICATIONS

Nozuyama et al, A Method of Estimating and Enhancing Test Quality Using Layout Information, Technical Report of IEICE, vol. CPM2002-152, pp. 1-6, Jan. 2003, Japan.
Stroud et al, Bridging Fault Extraction from Physical Design Data for Manufacturing Test Development, Proc. IEEE International Test Conference, pp. 760-769, Oct. 2000.
Dessai et al, Resistive Bridge Fault Modeling, Simulation and Test Generation, Proc. IEEE International Test Conference, pp. 596-605, 1999.
Sengupta et al, Defect-Based Test: A Key Enabler for Successful Migration to Structural Test, Intel Technology Journal, pp. 1-14, Q1'99.

* cited by examiner

*Primary Examiner*—Michael P Nghiem
(74) *Attorney, Agent, or Firm*—Amin, Turocy & Calvin, LLP

(57) ABSTRACT

The test pattern generating apparatus contains a module configured to generate short information indicative of a relationship between a logical value of an input signal of a cell and a voltage of an electrically shorted portion assumed at an output terminal of the cell; a module configured to calculate a logical threshold value of the input terminal of the cell so as to generate logical threshold value information; a module configured to extract a bridge fault information from layout information of an LSI; a module configured to generate a bridge fault list including a bridge fault type based on the bridge fault information, the short information, and the logical threshold value information; and a module configured to generate a test pattern which detects bridge faults in an adjacent signal wire pair and a bridge fault type.

20 Claims, 12 Drawing Sheets

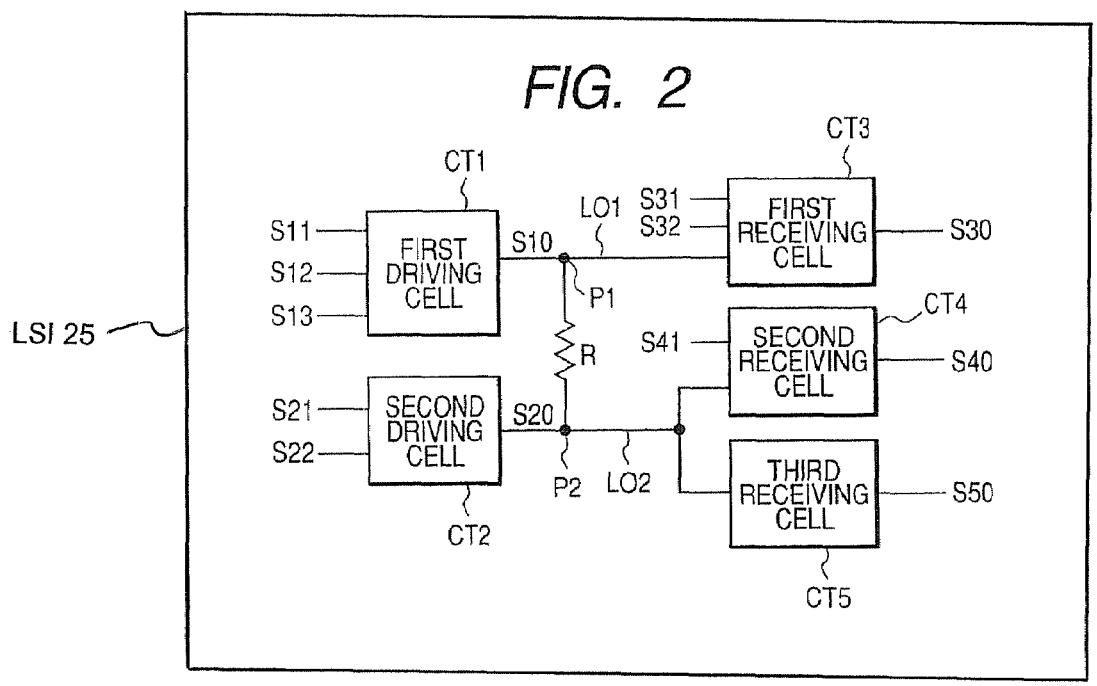
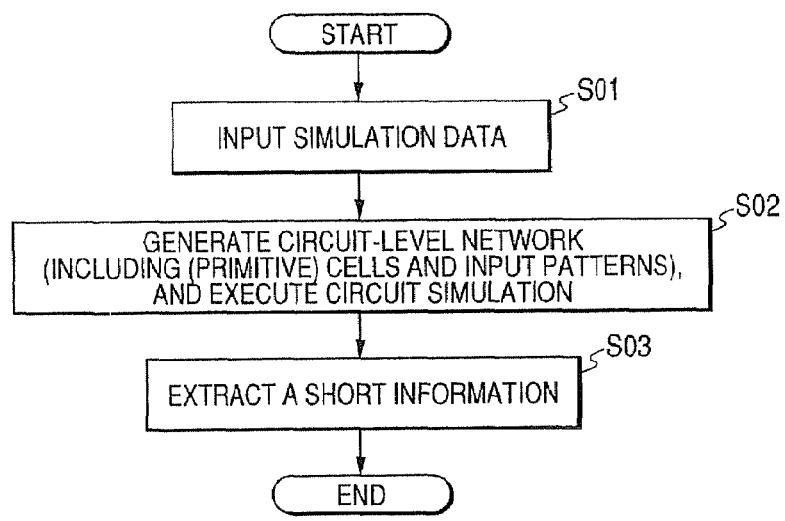

FIG. 4

```
*
*SPICE net for obtaining calculating bridging fault types*
*Signal_A driver: Iv
*Signal_B driver: AND2

.INCLUDE "spice.model"
.INCLUDE "Primitive/IV.spc
.INCLUDE "Primitive/AND2.spc

.TRAN 0.05ns 10n
VDD 1 0 DC=1.5V
VA1 INA1 0v PWL (0 0v 0.5n 1.5v 4n 1.5v 4.5n 0v)
VB1 INB1 0v PWL (0 1.5v 0.5n 0v 4n 0v 6.5n 1.5v)
VB2 INB2 0v PWL (0 1.5v 0.5n 0v 2n 0v 2.5n 1.5v)

XIV ZA INA1 0 1 IV
XAND2 ZB INB1 INB2 0 1 AND2

*RESISTANCE
R ZA ZB 0

*PRINT
.PRINT TRAN V(ZA) V(ZB)

.END
```

FIG. 5

```
<NAME OF CELL A. NAME OF OUTPUT TERMINAL>   (<NAME OF INPUT TERMINAL>,...)   <NAME OF CELL B. NAME OF OUTPUT TERMINAL>   (<NAME OF INPUT TERMINAL>,...) :
/01 (<INPUT OF A WHICH BECOMES 0>) (<INPUT OF B WHICH BECOMES 1>) <SHORT VOLTAGE> <INPUT FREQUENCY>,
          . .         . .
/10 (<INPUT OF A WHICH BECOMES 1>) (<INPUT OF B WHICH BECOMES 0>) <SHORT VOLTAGE> <INPUT FREQUENCY>,
          . .         . .
```

```
AND2.Z (A, B) NOR3.Z (A, B, C) :
  /01   (0, 0)  (0, 0, 0)   0.681  1 ,
  /10   (1, 1)  (1, 0, 0)   0.807  3 ,
        (1, 1)  (1, 1, 0)   0.759  3 ,
        (1, 1)  (1, 1, 1)   0.693  1 ;
                                   ↑
                         INPUT FREQUENCY
```

| OUTPUT | INPUT FREQUENCY | COMBINATION OF INPUTS | GROUP |
|---|---|---|---|
| Z=0 | 1 | (A, B, C)=(1, 1, 1) | — |
| Z=1 | 3 | (A, B, C)=(0, 1, 1), (1, 0, 1), (1, 1, 0) | FIRST GROUP |
| | 3 | (A, B, C)=(1, 0, 0), (0, 1, 0), (0, 0, 1) | SECOND GROUP |
| | 1 | (A, B, C)=(0, 0, 0) | THIRD GROUP |

FIG. 9

```
<SIGNAL A> <SIGNAL B> <ADJACENT WIRE LENGTH L> :
<NAME OF INSTANCE DRIVING SIGNAL A> (<[PRIMITIVE] CELL NAME>), (<TERMINAL NAME OF THE INSTANCE DRIVING SIGNAL A>, <TERMINAL NAME OF AN ENABLING SIGNAL> | <INPUT TERMINAL NAME>,...)
- <NAME OF INSTANCE RECEIVING SIGNAL A> (<[PRIMITIVE] CELL NAME>), (<TERMINAL NAME OF THE INSTANCE RECEIVING SIGNAL A>
<NAME OF INSTANCE DRIVING SIGNAL B> (<[PRIMITIVE] CELL NAME>), (<TERMINAL NAME OF THE INSTANCE DRIVING SIGNAL B>, <TERMINAL NAME OF AN ENABLING SIGNAL> | <INPUT TERMINAL NAME>,...)
- <NAME OF INSTANCE RECEIVING SIGNAL B> (<[PRIMITIVE] CELL NAME>), (<TERMINAL NAME OF THE INSTANCE RECEIVING SIGNAL B>
...
```

FIG. 10

```
<SIGNAL A> <SIGNAL B> <ADJACENT WIRE LENGTH L> ;
```

FIG. 11

<SIGNAL NAME> <NAME OF INSTANCE DRIVING SIGNAL> (<(PRIMITIVE) CELL NAME>), (<TERMINAL NAME OF THE INSTANCE DRIVING SIGNAL>, <TERMINAL NAME OF AN ENABLING SIGNAL>) | <INPUT TERMINAL NAME>,...)
- <NAME OF INSTANCE RECEIVING THE SIGNAL> (<(PRIMITIVE) CELL NAME>), <TERMINAL NAME THE INSTANCE RECEIVING THE SIGNAL>
...
- -

FIG. 12

<SIGNAL A> <SIGNAL B> <ADJACENT WIRE LENGTH L> <NAME OF A (PRIMITIVE) CELL DRIVING SIGNAL A> <NAME OF A (PRIMITIVE) CELL DRIVING SIGNAL B>.
<OUTPUT TERMINAL NAME> (<CONFIGURATION OF INPUT TERMINALS>) <NAME OF A (PRIMITIVE) CELL DRIVING SIGNAL B>.
<OUTPUT TERMINAL NAME> (<CONFIGURATION OF INPUT TERMINALS>):
- <BRIDGE FAULT TYPE> (<RELATIVE OCCURRENCE PROBABILITY> <PROPAGATION PROBABILITY>) <DETECTION CREDIBILITY>,
...
- -

FIG. 13
| SIGNAL A | SIGNAL B | WA TYPE | WO TYPE | AD TYPE | BD TYPE |
|---|---|---|---|---|---|
| 0 | 0 | 0 | 0 | 0 | 0 |
| 0 | 1 | 0 | 1 | 0 | 1 |
| 1 | 0 | 0 | 1 | 1 | 0 |
| 1 | 1 | 1 | 1 | 1 | 1 |
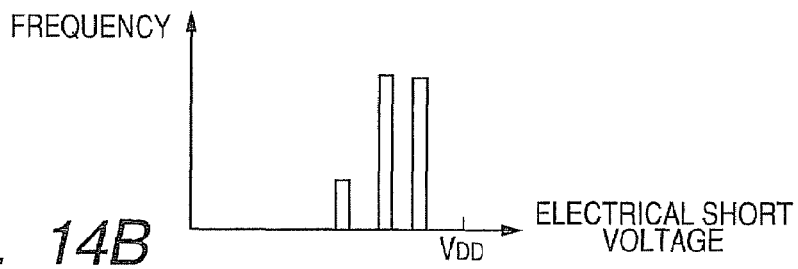
FIG. 14A
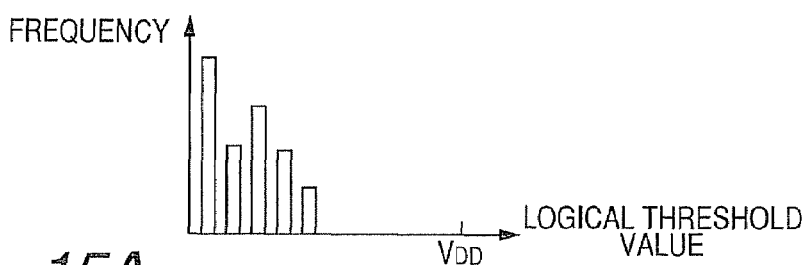
FIG. 14B
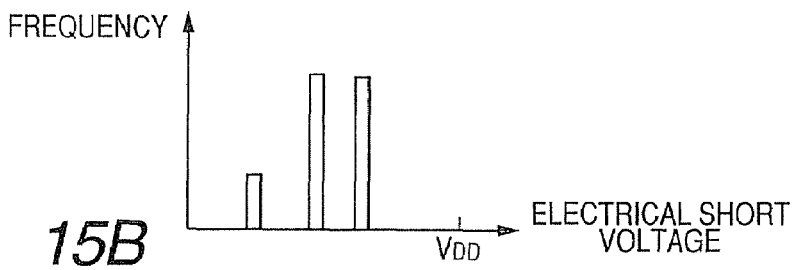
FIG. 15A
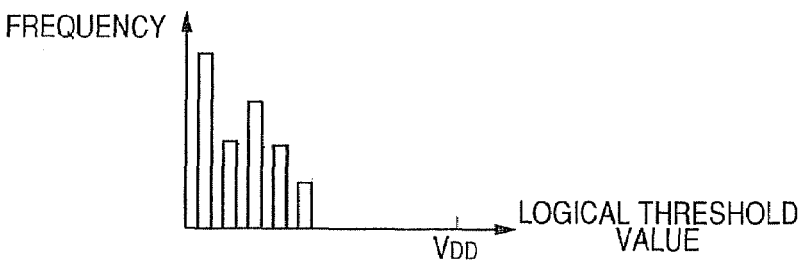
FIG. 15B

FAULT LIST AND TEST PATTERN GENERATING APPARATUS AND METHOD, FAULT LIST GENERATING AND FAULT COVERAGE CALCULATING APPARATUS AND METHOD

CROSS-REFERENCE TO RELATED APPLICATIONS

This application is based on and claims the benefit of priority from the prior Japanese Patent Application No. 2006-004943, filed on Jan. 12, 2006; the entire contents of which are incorporated herein by reference.

BACKGROUND

1. Technical Field

The present invention relates to a test of a semiconductor integrated circuit. More specifically, the present invention is directed to a fault list and test pattern generating apparatus, a fault list and test pattern generating method, a fault list generating and fault coverage calculating apparatus, and a fault list generating and fault coverage calculating method for a bridge fault test.

2. Description of Related Art

In accordance with the progress of shrinking of semiconductor processes, it is expected that the proportion of bridge faults among various faults occurring in semiconductor integrated circuits (LSIs) will much increase. A "bridge fault" in an LSI occurs (is assumed) in such a manner that a foreign particle (dust) is bridged over one set of signal wires (will be referred to as "signal wire pair" hereinafter) which are arranged in the adjacency to each other and can be extracted from the layout of the LSI, so that the wires are electrically shorted by the foreign particles.

Conventionally, bridge fault tests capable of detecting bridge faults have been brought into practice by use of an IDDQ (IDD Quiescent) test which can be easily applied to LSIs consisting of CMOS(Complimentary MOS) circuits which are dominant circuits of the present LSIs. In an IDDQ test, based on the fact that there is no DC current path and so that very little DC current flows in a fault-free CMOS circuit at a stable state, in such a case that a signal on one signal wire becomes "1" where a bridge fault occurs whereas a signal on the other signal wire of the corresponding signal wire pair becomes "0", a DC current (abnormal IDDQ) value which flow through an LSI is measured so as to detect the bridge fault (the bridge fault is "activated" by these signals). Test patterns including information on IDDQ measurement times are newly generated or selected from existing test patterns for the IDDQ test for bridge faults, so that as many bridge faults can be detected by small number of IDDQ measurement times as possible. However, since the shrinking of semiconductor processes has much progressed, especially in LSIs operable in high clock frequencies, IDDQ current values of fault-free samples of such LSIs has remarkably increased and to detect abnormal IDDQ value accompanied by a bridge fault bas become vary difficult, so that the IDDQ test can be hardly applied.

As a consequence, instead of the above-explained IDDQ test, such a test capable of detecting a bridge fault in such a manner that a bridge fault detecting-purpose test pattern is inputted to an LSI, and then, a logical value of an output terminal is compared with an expected value so as to perform a good/no-good judgement (will be referred to as simply as "bridge fault test" hereinafter) has become a very important test as the bridge fault test which is practically applied to LSIs (refer to, for example, patent publication 1). However, such bridge fault tests which may be applied to a recent very large-scaled LSI have not been sufficiently accomplished except for such a simple bridge fault test which merely handles a wired-AND type bridge fault or a wired-OR type bridge fault.

Generally speaking, in the case that logical values of signals of a signal wire pair where a bridge fault occurs (is assumed) are different from each other, the bridge fault is "activated", while the activated bridge fault propagates in an LSI, and, if it is outputted to the outside of the LSI as a different logical value from that of an expected value, the bridge fault is detected. In this case, the term "propagation of bridge fault" implies such an operation that such an error signal is propagated within an LSI, while this error signal is different from a signal under fault-free condition and is produced due to an influence of a bridge fault. The error signal is propagated within the LSI and then is reached to an output terminal of the LSI, so that the bridge fault which is activated by a bridge fault test pattern and causes the generation of the error signal can be detected. In general, a test pattern used to detect a bridge fault is generated by an automatic test pattern generation (ATPG) tool which is used so as to detect a bridge fault based upon logical connection network information of an LSI. The bridge faults extracted from the layout of the LSI are processed in relation to signals appeared on the logical connection network of the LSI. It should be understood that "precision", on a bridge fault test which, in other words, is reliability on the modeling of real bridge faults and the detection and non-detection of these faults may be largely influenced by the following various aspects, namely, driving (primitive) cells for driving two signal wires where a bridge fault occurs; logical values of input signals to the driving cells; a resistance value between electrically shorted wires; receiving (primitive) cells which receive respective signals; logical threshold values of input terminals of the receiving cells. In more details, the above-explained "precision" of the bridge fault test is given as follows;

a bridge fault behaves as which fault type; and what degree of credibility is expected at which such a bridge fault judged as "detected" or "not-detected" by a test pattern is actually detected. Therefore, it is important that these items may be extracted and modeled in high precision as being permitted as possible.

On the other hand, if the precision of detecting operation for bridge faults by the bridge fault test pattern may achieve a practical precision, even when this detecting precision is further improved, then there is such a tendency that the additional effect of the bridge fault test is lowered. Therefore, it is practically very important to generate bridge fault test patterns in a short time even for a current large-scaled LSI, with maintaining practically sufficient precision.

A bridge fault test (and test pattern) having high precision on detecting bridge faults corresponds to such a bridge fault test that an assumed bridge fault well models (describes) that which occurs in an actual LSI internal portion in higher precision; and a bridge fault judged as "detected" by an (generated) test pattern is actually (in high probability) activated and propagated within the LSI and then can be detected, also a bridge fault judged as "not-detected" by the pattern is not detected in a high probability. As previously explained, such a fact as to whether or not the bridge fault is activated and propagated in the LSI may be determined based upon the driving circuits (cells) for driving the respective signals of the signal wire pair where the bridge fault occurs; the inputs to the driving circuits; the resistance values between the signal wires of the signal wire pair, the receiving circuits (cells) into which the activated error signal on the signal wires is inputted; and the logical threshold values of the input terminals of the receiving circuits to which the error signal is inputted. However, it is very difficult to acquire all of the above-explained information in the large-scaled LSI. In general, aplenty of time is required to acquire the information, and to generate an effective bridge fault test pattern by utilizing the above-described information. As a consequence, it is practically difficult to form a bridge fault test pattern capable of detecting bridge faults in a highest precision. (See JP-A-2003-107138.)

SUMMARY

According to an aspect of the invention, there is provided a fault list and test pattern generating apparatus including: a short information generating module configured to generate an electrical short information representative of a relationship between logical values of input signals of a plurality of (primitive) cells and voltage values at shorted portions assumed at outputs of the plurality of (primitive) cells; a threshold value information generating module configured to calculate logical threshold values of the input terminals of the plurality of (primitive) cells so as to generate a logical threshold value information; an extracting module configured to extract from a layout information of a semiconductor integrated circuit a bridge fault information including; a signal information of a pair of adjacent wires within a predetermined adjacent space; a wire length of the pair of adjacent signal wires; an information as to driving cells included in the plurality of cells and driving the pair of adjacent signal wires, and an information of receiving cells included in the plurality of cells, and to which signals on the pair of adjacent wires are inputted; a fault list generating module configured to generate, base on the bridge fault information, the electrical short information and the logical threshold value information related to the driving cells and the receiving cells, respectively, abridge fault list including a bridge fault type determined by a relationship between the voltage values at the shorted portion and the logical threshold values of the input terminals of the receiving cells; and a test generation module configured to generate, based on the bridge fault list, a test pattern that detects bridge faults in the pairs of adjacent wires and bridge fault types.

According to another aspect of the invention, there is provided a fault list and test pattern generating method, including: generating an electrical short information representative of a relationship between logical values of input signals of a plurality of (primitive) cells and a voltage values at electrically shorted portions assumed at outputs of the plurality of (primitive) cells; calculating logical threshold values of the input terminals of the plurality of (primitive) cells so as to generate a logical threshold value information; extracting, from a layout information of a semiconductor integrated circuit, abridge fault information including a signal information of a pair of adjacent wires within a predetermined adjacent space, a wire length of the pair of adjacent signal wires, an information as to driving cells for driving the pair of adjacent signal wires which included in the plurality of cells, and an information of receiving cells to which signals on the adjacent wires are inputted and which is included in the plurality of cells; generating, based on the bridge fault information, the read electrical short information and the read logical threshold value information related to the driving cells and the receiving cells, respectively, a bridge fault list including a bridge fault type determined by a relationship between the voltage values at the shorted portion and the logical threshold values of the input terminals of the receiving cells; and generating, based on the bridge fault list, a test pattern which detects bridge faults in the pairs of adjacent wires and the bridge fault types.

According to still another aspect of the invention, there is provided a fault list generating and fault coverage calculating apparatus including: a short information generating module configured to generate an electrical short information representative of a relationship between logical values of input signals of a plurality of (primitive) cells and voltage values at electrically shorted portions assumed at outputs of the plurality of (primitive) cells; a threshold value information generating module configured to calculate logical threshold values of the input terminals of the plurality of (primitive) cells so as to generate a logical threshold value information; an extracting module configured to extract from a layout information of a semiconductor integrated circuit a bridge fault information including; a signal information of a pair of adjacent wires within a predetermined adjacent space; a wire length of the pair of adjacent signal wires; an information as to driving cells included in the plurality of cells and driving the pair of adjacent signal wires, and an information of receiving cells included in the plurality of cells, and to which signals on the pair of adjacent wires are inputted; a fault list generating module configured to calculate, based on the bridge fault information, the short information and the logical threshold value information related to the driving cells and the receiving cells, respectively, a detection credibility at which abridge fault in the pair of adjacent wires included in a bridge fault list is activated and propagated in the semiconductor integrated circuit to be detected, and configured to generate the bridge fault list including the detection credibility;

a test judgment module configured to judge as to whether or not the bridge fault in the pair of adjacent wires included in the bridge fault list can be detected by a test pattern that is applied to the semiconductor integrated circuit based on the detection credibility so as to generate a fault detection information; and a calculating module configured to calculate, based on the fault detection information and the bridge fault list, a fault coverage of the test pattern which is weighted based upon the detection credibility and the wire length.

According to still another aspect of the invention, there is provided a fault list generating and fault coverage calculating method, including: generating a short information representative of a relationship between logical values of input signals of a plurality of (primitive) cells and voltage values at electrically shorted portions assumed at outputs of the plurality of (primitive) cells; calculating logical threshold values of the input terminals of the plurality of (primitive) cells so as to generate a logical threshold value information; extracting, from layout information of a semiconductor integrated circuit, a bridge fault information including a signal information of a pair of adjacent wires within a predetermined adjacent space, a wire length of the pair of adjacent wires, an information as to driving cells for driving the pair of adjacent wires which are included in the plural cells, and an information of receiving cells to which a signal on the adjacent wire pair is inputted, and which are included in the plural cells; calculating, based on the bridge fault information, the short information and the logical threshold value information related to the driving cells and the receiving cells, respectively, a detection credibility at which a bridge fault in the pair of adjacent wires included in a bridge fault list is activated and propagated in the semiconductor integrated circuit to be detected; generating the bridge fault list including the detection credibility;

judging as to whether or not the bridge fault in the pair of adjacent wires included in the bridge fault list can be detected by a test pattern which is applied to the semiconductor integrated circuit based on the detection credibility so as to form a fault detection information; and calculating, based on the fault detection information and the bridge fault list, a fault coverage of the test pattern which is weighted based upon the detection credibility and the wire length.

BRIEF DESCRIPTION OF THE DRAWINGS

FIG. 2 is an exemplary circuit diagram for schematically indicating an example of a bridge fault;

FIG. 3 is a flow chart for explaining a short information generating method according to the first embodiment;

FIG. 4 shows an example of circuit-level net lists consisting of primitive cells which are used to obtain data for generating a short information in the fault list and test pattern generating apparatus according to the first embodiment;

FIG. 5 shows an example as to a format of a short information according to the first embodiment.

FIG. 9 indicates an example as to a format of bridge fault information according to the first embodiment;

FIG. 10 shows an example as to another format of bridge fault information according to the first embodiment;

FIG. 11 indicates an example as to another format of bridge fault information according to the first embodiment;

FIG. 12 indicates an example as to a format of a bridge fault list according to the first embodiment;

FIG. 13 represents a table of bridge fault types according to the first embodiment;

FIG. 14A shows an example as to a distribution of electrical short voltages;

FIG. 14B shows an example as to a distribution of logical threshold values;

FIG. 15A shows another example as to a distribution of electrical short voltages;

FIG. 15B shows another example as to a distribution of logical threshold values;

DESCRIPTION OF THE EMBODIMENTS

Figure 1:
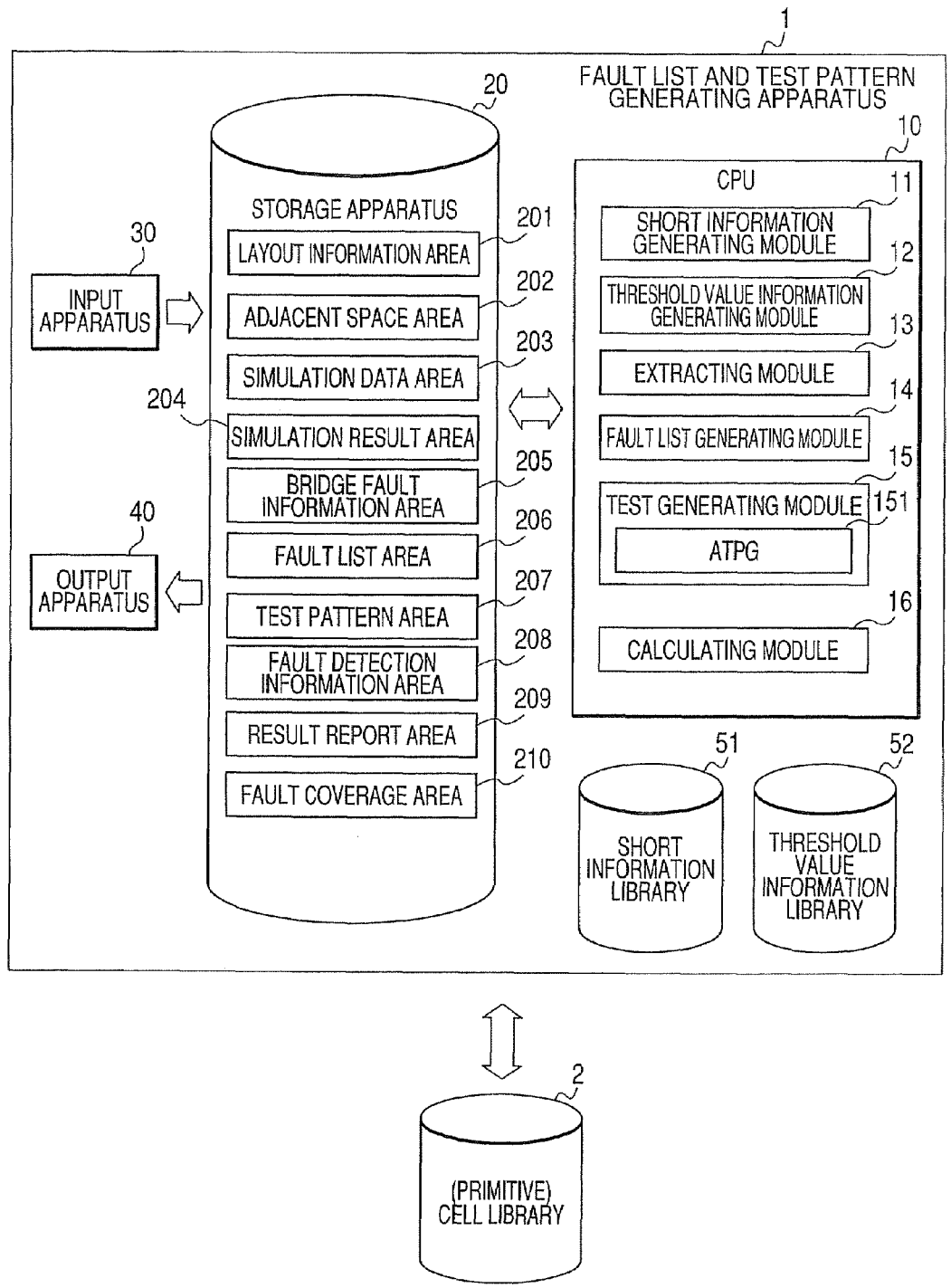
FIG. 1 is an exemplary schematic diagram for showing an arrangement of a fault list and test pattern generating apparatus according to a first embodiment of the present invention.

Next, a description is made of a first embodiment and a second embodiment of the present invention with reference to drawings. It should be understood that the same reference numerals shown in the drawings will be employed as those for denoting the sand, or similar portions. Also, it should be noted that since the below-mentioned first and second embodiment are merely employed in order to exemplify apparatuses and methods which embody the technical idea of the present invention, the technical idea of the present invention does not specifically restrict structures and arrangements of structural components to the below-mentioned structures and arrangements the technical idea of the present invention may be changed in various manners within a scope for a patent.

First Embodiment

As indicated in FIG. 1, a fault list and test pattern generating apparatus 1, according to a first embodiment of the present invention, is equipped with a short information generating module 11, a threshold value information generating module 12, an extracting module 13, a fault list generating module 14, and a test generating module 15. The short information generating module 11 generate short information which indicates a relationship between logical values of input signals of a plurality of (primitive) cells and voltage values of electrically shorted portions which are assumed to output terminals of the plural cells. The threshold value information generating module 12 calculates logical threshold values for input terminals of the plural cells so as to generate logical threshold value information. The extracting module 13 extracts bridge fault information from layout information of an LSI, while the bridge fault information includes signal information of an adjacent wire pair within an adjacent space range to which a wire-to-wire space has been set, a wire length of the adjacent wire pair, information of driving cells which drive the adjacent wire pair which constitutes a portion of the plural cells, and also, information of receiving cells into which signals are inputted, while the signals are propagated to the adjacent wire pair which constitutes a portion of the plural cells. The fault list generating module 14 generates a bridge fault list which includes bridge fault types determined by the relationship between the voltages of the electrically shorted portions and the logical threshold values of the input terminals of the receiving cells by employing the bridge fault information, the short information and the logical threshold value information related to the driving cells and the receiving cells, respectively. The test generating module 15 generates a test pattern for detecting bridge faults in the adjacent wire pairs by employing the bridge fault list. It should be noted that the fault list and test pattern generating apparatus 1 may alternatively calculate detection credibility (will be explained later). The bridge fault type and the detection credibility will be explained later.

Since the test generating module 15 may execute an auxiliary fault simulation with employment of the generated test pattern, the test generating module 15 may alternatively judge as to whether or not a bridge fault in an adjacent wire pair in a circuit portion in an LSI in which bridge faults are mainly out of detection subjects by an ATPG tool is detected so as to generate auxiliary fault detection information. The test generating module 15 judges as to whether or not a bridge fault is detected based upon only a bridge fault type and logical connection information of a circuit. The calculating module 16 shown in FIG. 1 calculates a fault coverage of a test pattern which is weighted by both detection credibility and a wire length of an adjacent wire pair by employing detection credibility at which the bridge fault detected by the test pattern is actually detected, and the bridge fault list.

As indicated in FIG. 1, the short information generating module 11, the threshold value information generating module 12, the extracting module 13, the fault list generating module 14, the test generating module 15, and the calculating module 16 are included in a central processing unit (CPU) 10. The fault list and test pattern generating apparatus 1 is further equipped with a storage apparatus 20, an input apparatus 30, an output apparatus 40, a short information library 51, and a threshold value library 52. The short information library 51 stores thereinto short information as to the plural cells. Also, a (primitive) cell library 2 shown in FIG. 1 stores thereinto circuit simulation models of the cells.

The storage apparatus 20 is equipped with a layout information area 201, an adjacent space area 202, a simulation data area 203, a simulation result area 204, a bridge fault information area 205, a fault list area 206, a test pattern area 207, a fault detection information area 208, a result report area 209, and a fault coverage area 210.

The layout information area 201 stores thereinto layout information as to an LSI (will be referred to "subject LSI" hereinafter) which constitutes a subject of a bridge fault test. The layout information includes detailed arrangement and connection information as to (primitive) cells, signal wires, and vias, and information as to signal wire layers, which are used in the subject LSI. Normally, the layout information becomes perfect in combination with both information as to shapes of cells and terminal positions, and a design rule such as minimum wire spaces.

The adjacent space area 202 stores thereinto a preset adjacent wire space. The adjacent wire space will be later explained in detail. The simulation data area 203 stores thereinto a circuit-level description of a (primitive) cell read out from the cell library 2, and a circuit simulation-purpose detailed behavior model of transistors used in the circuit-level description. There are some cases that the circuit simulation-purpose detailed behavior model of the transistors is saved and managed irrespective of the cell library. The simulation result area 204 stores thereinto an execution result of a circuit simulation. The bridge fault information area 205 stores thereinto bridge fault information extracted from the layout information. The fault list area 206 stores thereinto a bridge fault list. The test pattern area 207 stores thereinto a test pattern for a bridge fault test which is applied to the subject LSI. The fault detection information area 208 stores thereinto fault detection information which is generated by executing both the ATPG and a fault simulation. The result report area 209 stores thereinto an execution result report when generating of a test pattern and generating of fault detection information are carried out. The fault coverage area 210 stores thereinto a fault coverage of a test pattern for detecting bridge faults.

The input apparatus 30 is arranged by a keyboard, a mouse, a light pen, a flexible disk apparatus, or the like. A person who generates a test pattern and calculates a fault coverage can designate layout information and an adjacent space by operating the input apparatus 30. Also, the person can enter an instruction for executing and ceasing a test pattern generating operation.

Also, as the output apparatus 40, a display, and a printer may be used so as to display an execution result report, a fault coverage, and the like, or a recording apparatus may be used so as to save them on a computer readable recording medium. In this example, a "computer readable recording medium" implies, for instance, such a medium capable of recording electronic data as an external memory apparatus of a computer, a semiconductor memory, a magnetic disk, and the like. Concretely speaking, a flexible disk, a CD-ROM, an MO disk, and the like are involved in the above-explained "computer readable recording medium."

An example of a bridge fault will now be explained with reference to FIG. 2. FIG. 2 is such an example that a signal wire L01 which connects a first driving cell CT1 to a first receiving cell CT3, and another signal wire L02 which connects a second driving cell CT2 to both a second receiving cell CT4 and a third receiving cell CT5 are electrically shorted by a resistor R. A signal S11, a signal S12, and a signal S13 are inputted to the first driving cell CT1, and the first driving cell CT1 outputs a signal S10 to the first receiving cell CT3. A signal S21 and a signal S22 are inputted to the second driving cell CT2, and the second driving cell CT2 outputs a signal S20 to the second receiving cell CT4 and the third receiving cell CT5. A signal S31 and another signal S32 are furthermore inputted to the first receiving cell CT3, and the first receiving cell CT3 outputs a signal S30. A signal S41 is furthermore inputted to the second receiving cell CT4, and the second receiving cell CT4 outputs a signal S40. The third receiving cell CT5 outputs a signal S50.

It is so judged that a bridge fault which has been activated and has been assumed in FIG. 2 may be propagated or not via the first receiving cell CT3, the second receiving cell CT4, or the third receiving cell CT5 to the output terminal of the subject LSI 25 based upon a relationship between a voltage V1 of a short point P1 between the signal wire L01 and the resistor R, and a logical threshold value of an input terminal of the first receiving cell CT3, and between a voltage V2 of a short point P2 between the signal wire L02 and the resistor R, and a logical value of an input terminal of the second receiving cell CT4, or a logical threshold value of an input terminal of the third receiving cell CT5. For instance, in the case that the signal S10 is a low level ("0") and the signal S20 is a high level ("1"), if the voltage V1 becomes higher than, or equal to the logical threshold value of the input terminal of the first receiving cell CT3, then a logic value of an output of the first receiving cell CT3 is changed into that which is different from that of the normal (fault-free) condition. That is to say, an error signal caused by the activated bridge fault can be propagated via the first receiving cell CT3 to an output terminal of the subject LSI 25. In other words, the bridge fault may be detected. In actuality, a test pattern which activates each of the bridge faults so as to generate an error signal, propagates the error signal up to an output terminal of the subject LSI 25, and detects a bridge fault corresponding to the error signal is basically generated by an ATPG tool. On the other hand, in such a case that the signal S10 is a low level and the signal S20 is a high level, when the voltage V1 is lower than the logical threshold value of the input terminal of the first receiving cell CT3, the bridge fault is activated but unable to change the logic value of the output of the first receiving cell CT3 into such a logic value which is different from that under the normal (fault-free) condition, so that the bridge fault is not sufficiently activated and the error signal is not effectively generated, i.e., not propagated to the output terminal of the subject LSI 25. In other words, the bridge fault is not detected via the first receiving cell CT3. In this case, if the voltage V2 becomes lower than the logical threshold value of the input terminal of either the second receiving cell CT4 or the third receiving cell CT5, then the error signal caused by the activated bridge fault may be propagated via either the second receiving cell CT4 or the third receiving cell CT5 to an output terminal of the subject LSI 25. That is to say, the bridge fault may be detected by employing a proper test pattern.

There are some cases that such a condition as to whether or not the logic value of the output of the first receiving cell CT3 is changed when the bridge fault is activated may also depend upon the logic values of the signals S31 and S32 which are inputted to the first receiving cell CT3. For instance, in the case that the first receiving cell CT3 is a composite logic gate, there is a certain possibility that the logical threshold value of the input terminal of the first receiving cell CT3 into which the signal S10 is inputted is changed in response to the logic values of the signals S31 and S32. It should also be noted that both the voltage V1 and the voltage V2 may depend upon the value of the resistance R; the logic values of the signal S11, the signal S12, and the signal S13 which are inputted to the first driving cell CT1, and also, the logic values of the signal S21 and the signal S22 which are inputted to the second driving cell CT2. As previously explained, when the signal S10 and the signal S20 are set to the opposite logic values to each other so that the bridge fault assumed between the signal wire L01 and the signal wire L02 is activated, an error signal which is different from the signal under the normal (fault-free) condition can be propagated up to the output terminal of the first receiving cell CT3, the second receiving cell CT4, or the third receiving cell CT5, by a proper test pattern. Furthermore, by the test pattern, in the case that this error signal is propagated up to an output terminal of the subject LSI, the bridge fault occurred between the signal wire L01 and the signal wire L02 is detected.

As previously explained, depending upon the logic values of the output signals of the driving cells of the adjacent signal wire pair, which depend on the combination of the logic values of the input signals of the driving cells of the adjacent signal wire pair, and also, the logical threshold values of the input terminals of the receiving cells, it is so determined as to whether or not the bridge fault occurred in the adjacent signal wire pair can be propagated via the receiving cells to the outputs of the receiving cells. Furthermore, there are some possibilities that the combination of sub-input signals of a receiving cell may give an influence as to whether or not the bridge fault is propagated via the receiving cell to its output. A "sub-input signal" corresponds to such an input signal other than a signal which causes a bridge fault. The short information generating module 11 calculates voltages at electrically shorted portions which are assumed in a signal wire pair by way of a circuit simulation so as to generate a short information library, while all of combinations of driving cells which can drive the adjacent signal wire pair are employed as subjects, and both logic values of arbitrary two output signals of the driving cells and logic values of input signals of the driving cells are considered. Referring now to a flow chart indicated in FIG. 3, a description is made of a method for generating a short information library by the short information generating module 11.

(a) In a step S01, the short information generating module 11 reads out both a circuit-level description of (primitive) cells and a detailed behavior model of transistors used in the circuit-level description for a circuit simulation from the cell library 2, and then stores the read circuit description and detailed behavior model in the simulation data area 203.

(b) In a step S02, the short information generating module 11 generates such a simulation-purpose circuit-level net list (including input patterns) that two arbitrary cell outputs stored in the simulation data area 203 are shorted via the resistance R, and executes circuit simulations respectively based upon all of input combinations as to the generated net list. The net lists to be generated include such a net list that two outputs of the same cells (cells having the same name) are shorted with each other. FIG. 4 indicates an example of a circuit-level net list. The net list shown in FIG. 4 corresponds to such a net list that an output ZA of a cell IV which drives a signal "Signal_A" is connected to an output ZB of a cell AND2 which drives a signal "Signal_B" by way of a resistance R. Although the circuit simulation is carried out while the resistance R is basically selected to 0, the value of the resistance R may be set to any other numerals than 0. The simulation execution result is stored in the simulation result area 204.

(c) In a step S03, the short information generating module 11 reads out the execution result of the circuit simulation from the simulation result area 204. The short information generating module 11 extracts a voltage value of the shorted portion (short voltage) from the execution result of the circuit simulation. The information such as the extracted short voltage value is stored in the short information library 51 as the short information.

The short information generating module 11 generates the above-explained short information as to all of combinations of two arbitrary cells included in the cell library 50. Generally speaking, since works for generating the short information need a plenty of CPU time, the short information as to only cells used in the subject LSI may be alternatively generated. FIG. 5 represents a format example of the short information. As indicated in FIG. 5, the short information is generated with respect to all of combinations between inputs of a cell A and inputs of another cell B. An item "input frequency" shown in FIG. 5 indicates how many sorts of combinations of the substantially (electrically) same inputs as to either the cell A or the cell B are present. This input frequency will be explained later.

Figures 6, 7, 8:
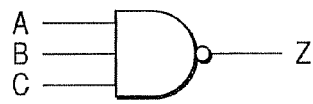
FIG. 6 indicates an example as to a format of a short information according to the first embodiment.
FIG. 7 is a circuit diagram for schematically indicating an example of a NAND circuit.
FIG. 8 shows an example as to grouping information according to the first embodiment.

FIG. 6 shows a more concrete example of the short information. FIG. 6 indicates the short information in such a case that an output terminal of an AND circuit "AND2" is shorted to an output terminal of a NOR circuit "NOR3." As indicated in FIG. 6, signals are inputted via input terminals A and B to the AND circuit AND2, and then, an output signal is outputted via an output terminal Z therefrom. Signals are inputted via input terminals A, B, C to the NOR circuit NOR3, and then, an output signal is outputted via an output terminal Z therefrom. For instance, in such a case that all of the signals inputted to the AND circuit AND2 are equal to 0, and all of the signals inputted to the NOR circuit NOR3 are equal to 0, the logic value of the signal outputted from the AND circuit AND2 becomes 0, the logical value of the signal outputted from the NOR circuit NOR3 becomes 1, and also, the short voltage becomes 0.681 V. An term "input frequency" of FIG. 6 indicates how many sorts of combinations of the electrically (substantially) same inputs as to either the AND circuit AND2 or the NOR circuit NOR3 are present. For example, such input combinations (1, 0, 0) that any one of the signals via the terminals A, B, C inputted into the NOR circuit NOR3 becomes 0 are 3 sorts. As a result, the input frequency of the input combinations (1, 0, 0) becomes 3. On the other hand, such an input combination (1, 1, 1) that all of the signals inputted into the NOR circuit NOR3 are equal to 1 is 1 sort. As a result, the input frequency of the input combinations (1, 1, 1) becomes 1. The combinations of the inputs may be properly grouped based upon a result (either short voltage or logical threshold value) of a circuit simulation.

FIG. 8 shows a grouped information in which the combinations of the inputs to the NAND circuit NAND3 shown in FIG. 7 are grouped. As indicated in FIG. 8, in the case that combinations of the inputs to the NAND circuit NAND3 are electrically identical to each other, more specifically, in view of load driving forces of output signals, these combinations are classified as the same group; and a total group number of the NAND circuit NAND3 in which the logic value of the output signal is equal to 1 becomes 3. A group 1 includes such an input combination that only one of the three input signals is equal to 0, and an input frequency thereof is equal to 3. A group 2 includes such an input combination that only one of the input signals is equal to 1, and an input frequency thereof is equal to 3. A group 3 includes such an input combination that any one of the input signals is equal to 0, and an input frequency thereof is equal to 1.

Within the same group, short voltages and values of supply current (short supply current values flowing through shorted portions) are substantially equal to each other. As a result, it is possible to check as to whether or not a bridge fault can be detected as to one input combination within the same group. In other words, utilization of the grouped information may become important as to the following aspects: That is, an entire amount of calculation is reduced, and high precision within an allowable calculation amount range is secured. As to such cells as a NAND circuit and a NOR circuit, load driving forces of cells are changed, depending upon inputs thereof. For instance, in the groups shown in FIG. 8, "1" driving force of a load is large in this order of the group 3, the group 2, and the group 1. However, as to cells such as an AND circuit and an OR circuit, a buffer is provided at an output portion in order to increase a load driving force. As a result, an attention should be paid to such a point that when these cells output the same logical values, the load driving forces are equal to each other.

There is such opportunities that there is a bridge fault among outputs and inputs of a hard macro block having a large scale such as a memory and those of primitive (basic) cells, for example, an AND circuit and a NOR circuit. As a consequence, a bridge fault composed of signals related to a hard macro block may be employed as a bridge fault detection subject. In the case that a memory is selected as abridge fault detection subject, if a circuit simulation is carried out by employing a net list which is simplified by extracting only necessary portions such as address inputs and output buffers (including output enabling signal) for outputting data while omitting a description of memory cells portion, then the circuit simulation may be carried out in a higher efficiency.

Next, a description is made of a method in which the threshold value information generating module 12 generates logical threshold value information. In the case that cells correspond to a combinational circuit, while an input voltage at an arbitrary 1 input of the respective input groups of the cells is slightly changed, a circuit simulation is executed, and an input voltage when a logical value of an output is changed is defined a logical threshold value. In the case of such a memory circuit as a flip-flop and a latch, data is fetched at an edge of a clock signal. As a result, circuit simulations in the case that an input voltage of a data input is slightly different from each other are carried out respectively, and an input voltage of the data input when the logical value of the output is changed is defined as the logical threshold value.

The extracting module 13 extracts bridge fault information related to an adjacent wire pair within a predetermined adjacent space range from the layout information of the subject LSI. An adjacent space is set as a wire-to-wire space between adjacent signal wires where a bridge fault occurs. For instance, such a wire-to-wire space between adjacent signal wires is set as an adjacent space, where a bridge fault incidence becomes higher than, or equal to pre-determined probability based upon a distribution of a bridge fault incidence with respect to the wire-to-wire space of adjacent signal wires. While the bridge fault incidence depends upon the wire-to-wire space of the adjacent wire pair, generally speaking, the longer the length of wire-to-wire of the signal wire pair becomes, the smaller the bridge fault incidence becomes, A bridge fault incidence is calculated (estimated) based upon an evaluation result of a test element group (TEG), analysis result on faulty samples of the LSIs manufactured in the past, including those in which bridge faults are cause of faulty behavior, and the like.

The adjacent space may be set by employing, for instance, a minimum wire-to-wire space of the subject LSI. Concretely speaking, a space obtained by multiplying the minimum wire-to-wire space by an integer is set as the adjacent space. Alternatively, the adjacent space may be set based upon size distribution information of dusts on a water, which are detected in a process applied to the manufacturing of the subject LSI. For example, the size of the dusts where 90% of the entire distribution is included is defined as the adjacent space. The size distribution of the dusts may be acquired from a dust investigation result in a process of products which were manufactured in the past by employing thereto the same process as the subject LSI.

The extracting module 13 extracts the bridge fault information from the signal wire position information and the detailed connection information included in the layout information of the subject LSI, while this bridge fault information includes a wire length of an adjacent signal wire pair (will be referred to as "adjacent wire length" hereinafter) whose wire-to-wire space is located in the adjacent space range, signal information of the adjacent signal wire pair, driving cell information related to driving cells which drive the adjacent signal wire pair, and receiving cell information related to receiving cells into which signals on the adjacent wire pair are inputted. A term "signal information" is a detailed name of signals in the subject LSI, which are propagated through respective signal wires of the adjacent wire pair. The driving cell information includes an output terminal name of a driving cell which outputs a signal to the adjacent wire pair. The receiving cell information includes an input terminal name of a receiving cell into which a signal propagates via the adjacent wire pair is inputted. FIG. 9 represents a format example of bridge fault information. The format of FIG. 9 is made of detailed contents related to the receiving cells, while the detailed receiving cell contents include a detailed name including up to a module hierarchy within the net list of the LSI of the signal wire through which the signal "A" is propagated; a detailed name including up to a module hierarchy within the net list of the LSI of the signal wire through which the signal "B" is propagated; an adjacent wire length "L"; output terminal names of driving cells which output signals to the adjacent signal wire pair respectively; and input terminal names of receiving cells into which respective signals propagating via the adjacent wire pair are inputted. A term of "instance name" included in the format shown in FIG. 9 implies a cell identification name included in the net list of the subject LSI. There are some cases that a plurality of tri-state buffers are connected to a bus, and the like, due to a necessity when a driving cell which produces a bridge fault is discriminated, an enabling terminal name may be included in the bridge fault information in combination with the output terminal names of the driving cells.

The bridge fault information may be alternatively subdivided into 2 sorts of files whose format examples are indicated in FIG. 10 and FIG. 11. FIG. 10 shows a file which describes both adjacent signal wire pair information and an adjacent wire length included in the bridge fault information shown in FIG. 9. FIG. 11 indicates a file which describes such information related to driving cells and output terminal names of the driving cells, and also, receiving cells and input terminal names of the receiving cells, which are included in the bridge fault information shown in FIG. 9. Since the bridge fault information is subdivided, the entire file size of the bridge fault information can be reduced. As a result, it is effective in the case that bridge fault information of a large-scaled LSI is extracted.

Next, a description is made of a method in which the fault list generating module 14 generates a bridge fault list by employing the bridge fault information, the short information, and the logical threshold value information. With respect to each of the adjacent signal wire pairs, the fault list generating module 14 acquires both the driving cell information and the receiving cell information included in the bridge fault information, and a short voltage at such a bridge fault assumed to the adjacent signal wire pair included in the short information so as to generate a bridge fault list. Furthermore, there are some possibilities that the fault list generating module 14 acquires a logical threshold value of receiving cells included in the logical threshold value information so as to add the acquired logical threshold value to the bridge fault list as an item. FIG. 12 indicates a detailed format example of a bridge fault list related to a bridge fault assumed to such an adjacent signal wire pair which is constituted by a signal wire through which the signal "A" is propagated, and another signal wire through which the signal "B" is propagated. A bridge fault type, relative occurrence probability, propagation probability, and detection credibility will now be explained which are included in the detailed format shown in FIG. 12.

The "bridge fault type" corresponds to a type of a bridge fault which is determined based upon a relationship between a short voltage and a logical threshold value of an input of a receiving cell. FIG. 13 indicates an example of a bridge fault type in the case that a bridge fault is assumed between an output terminal of a cell CA for outputting the signal A, and an output terminal of a cell CB for outputting the signal B. The example represented in FIG. 13 is such an example that the bridge fault type is classified into a wired-AND type (Wire-AND:WA), a wired-OR type (Wire-OR:WO), an A dominate type (A-Dominate:AD), and a B dominate type (B-Dominate; BD). The WA type implies that a logical value of a bridge fault to be propagated corresponds to a logical product between the logic value of the signal A and the logic value of the signal B. The WD type implies that a logical value of a bridge fault to be propagated corresponds to a logical sum between the logic value of the signal A and the logic value of the signal B. The AD type implies that a logic value of a bridge fault to be propagated corresponds to the logic value of the signal A. For instance, when the load driving force of the cell CA is much larger than that of the cell CB, the bridge fault type becomes the AD type. The BD type implies that a logic value of a bridge fault to be propagated corresponds to the logic value of the signal B. For instance, when the load driving force of the cell CB is much larger than that of the cell CA, the bridge fault type becomes the BD type. The bridge fault type is determined based upon a relationship between the short voltage and the logical threshold value of the receiving cell. As a consequence, even when the bridge faults occur at the same portion, the bridge fault types are varied based upon combinations of input signals of driving cells and in some cases logical threshold values of input terminals of receiving cells. Although not described in detail, in this specification, there is another method for classifying the bridge fault types not into the above-explained WA type, WO type, AD type, DB type, but into other types based upon strengths between the signal A and the signal B. Even in this classifying method, the idea of the present invention may become valid.

The "relative occurrence probability" corresponds to such a probability that a combination of specific inputs occurs, and in this example, such a value obtained by dividing input frequencies of combinations as to input signals of cells which output the signal A and the signal B by a total number of possible combinations is defined as the relative occurrence probability. More correctly speaking, such a probability that a logical value of each of the input signals becomes either 0 or 1 may be strictly calculated so as to calculate the relative occurrence probability. In other words, if combinations of input signals own larger input frequencies, then relative occurrence probability becomes large.

The "propagation probability" is such a probability that a bridge fault may be propagated via a receiving cell to an output of the receiving cell, and depends upon a relationship between a short voltage and a logical threshold value of the receiving cell. While exemplifying such a case that a logic value of a signal becomes 0 due to a bridge fault and the logic value thereof under the normal (fault-free) condition is 1, the propagation probability will be explained as follows: That is, in the case that the short voltage is lower than the logical threshold value of the input terminal of the receiving cell, an error signal caused by the activated bridge fault appears at the output of the receiving cell. In other words, the error signal may be propagated via the receiving cell in the LSI. That is to say, the test generating module 15 executes a fault simulation with employment of a bridge fault test pattern of the subject LSI, and then, the error signal of the bridge fault which is judged as "detected" is actually propagated in the LSI to be reached to an output terminal of the LSI. In other words, this bridge fault which is judged as "detected" is actually detected. On the other hand, in the case that the short voltage is higher than the logical threshold value of the input terminal of the receiving cell, the error signal of the bridge fault is blocked by the receiving cell, and thus, cannot be propagated within the LSI. In other words, even when the bridge fault is judged by the test generating module 15 as "detected", the error signal can not go beyond the output of the receiving cell and is not propagated. As a result, this error signal cannot be propagated within the LSI but also cannot be reached to an output terminal of the LSI. In other words, this bridge fault is not actually detected.

FIG. 14A shows an example as to a distribution of a short voltage, in FIG. 14B shows an example as to a distribution of a logical threshold value. In the examples as to the distributions of the short voltage and the logical threshold value indicated in FIG. 14A and FIG. 14B, there is no such a short voltage lower than the distribution of the logical threshold value. As a consequence, a bridge fault type in which a logic value of a signal having the logical value of 1 under normal (fault-free) condition becomes 0 due to the bridge fault is blocked by the receiving cell, and cannot be propagated in the LSI. In other words, the propagation probability is 0. Conversely, in this case, if there is such a bridge fault type in which a logic value of a signal having the logic value of 0 under normal condition becomes 1 due to the bridge fault, then an error signal may be propagated in the LSI via the receiving cell. In other words, the propagation probability becomes 1. It should be noted that a voltage "$V_{DD}$" corresponds to a power supply voltage of the subject LSI. In examples as to the distributions of the short voltage and the logical threshold value indicated in FIG. 15A and FIG. 15B, there is such a short voltage which is overlapped with the distribution of the logical threshold value. That is to say, even when a bridge fault corresponds to such a bridge fault type in which a logic value of a signal having the logic value of 0 under normal (fault-free) condition becomes 1 due to the bridge fault, and also corresponds to a bridge fault type in which a logic value of a signal having the logic value of 1 under normal condition becomes 0 due to the bridge fault, there are some cases that the bridge fault may be propagated via the receiving cell in the LSI (propagation probability is larger than 0). Furthermore, although not shown in the drawing, there are such possibilities that a short voltage higher than a distribution of a logical threshold value is not present. In this case, such a bridge fault type in which a logic value of a signal having the logic value of 0 under normal condition becomes 1 due to the bridge fault is blocked by the receiving cell, and cannot be propagated in the LSI (propagation probability=0). On the other hand, if there is such a bridge fault type in which a logic value of a signal having the logic value of 1 under normal condition becomes 0 due to the bridge fault, then an error signal may be propagated within the LSI via the receiving cell. In other words, the propagation probability becomes 1. It should also be noted that as to the bridge fault caused by the same adjacent signal wire pair, a summation between propagation probability of such a bridge fault type that a logic value of a signal having a logic value of 0 under normal condition becomes 1 due to the bridge fault, and also, propagation probability of such a bridge fault type that a logic value of a signal having a logic value of 1 under normal condition becomes 0 due to the bridge fault is equal to 1.

The "detection credibility" indicates such an credibility that a bridge fault detected by the test generating module 15 is a bridge fault which can be actually detected and is propagated in an LSI to an output terminal of the LSI. Since the test generating module 15 judges as to whether or not a bridge fault is detected based upon only a bridge fault type and logical connection information of a circuit, there are some cases that the bridge fault which is judged by the test generating module 15 as "detected" is not propagated (not detected) up to an output terminal of the LSI based upon a relationship between a short voltage and a logical threshold value. As a result, the detection credibility may be utilized in order to properly evaluate a fault coverage of a test pattern. A description is made of a method for calculating detection credibility in the case that a logic value "1" of a signal under normal (fault-free) condition is changed into a logic value "0" due to a bridge fault. In this case, ratios of frequencies of short voltages $V_{S1}$ to $V_{Sn}$ of the input group 1 through an input group "n" with respect to all possible short voltage of bridge faults for each of the adjacent signal wire pairs are defined as relative frequencies $fV_{S1}$ to $fV_{Sn}$ (symbol "n" being natural number). Also, a ratio of a larger logical threshold value frequency than the short voltage $V_{Si}$ with respect to the input logical threshold values $V_{TH1}$ to $V_{THm}$ of the receiving cells of the above-explained bridge fault is defined as a relative frequency $fV_{THi}$ (symbol "m" being natural number). The detection credibility $T_{DT}$ is calculated based upon the below-mentioned formula (1)

$$T_{DT}=\Sigma i\{fV_{si}*(fV_{THi}/fV_{THall})\}/\Sigma ifV_{si} \quad (1)$$

In the above formula (1), symbol "Σi" implies a summation from i=1 to "n". Symbol "$fV_{THall}$" indicates a total value of the relative frequencies of the logical threshold values of the receiving cells.

The above explanation has exemplified that the logical value of the signal which is equal to 1 under normal condition is changed into 0 due to the bridge fault. Similarly, detection credibility of another bridge fault may be carried out in such a case that the logical value of the signal which is equal to 0 under normal condition is changed into 1 due to the bridge fault. For example, while the relative frequency is $fV_{THi}$, a ratio of a logical threshold value frequency smaller than the short voltage $V_{Si}$ may be employed.

As previously explained, the logical value of the bridge fault which is propagated within the LSI may be defined by the bridge fault type which is determined based upon the relationship between the short voltage and the logical threshold value of the reception terminal. In order to more simply define the bridge fault type, a proper value may be alternatively set to the logical threshold value of the input terminals of the receiving cells. For instance, such a voltage value of ½ of $V_{DD}$ equal to the power supply voltage of the subject LSI may be set as the logical threshold value of the input terminals of the receiving cells. In this case, there is a certain possibility that reliability of a result of detecting a bridge fault by the test generating module 15 is lowered. Alternatively, an investigation may be carried out as to a frequency distribution of logical threshold values of input terminals of all cells (also total number is considered) which are included in the subject LSI so as to set a proper logical threshold value. Furthermore, this frequency distribution is employed instead of the frequency distribution of the logical threshold value of the receiving cell corresponding to each of the bridge faults, and detection credibility of each of the bridge fault types may be calculated in accordance with the above-explained formula (logical threshold value distribution may be commonly used for all of bridge faults). As to merits of these methods, since detailed information of the receiving cells corresponding to the respective bridge faults need not be extracted, the CPU time in the large-scaled LSI can be largely reduced, and also, the precision may be achieved to some extent. However, there are some possibilities that the logical threshold value distribution in the large-scaled LSI may be fluctuated. As previously explained, there are some desirable cases that the logical threshold value distribution of the input terminals of the receiving cells corresponding to the bridge faults in each of the adjacent signal wire pairs is calculated.

The test generating module 15 generates a test pattern for detecting bridge faults in an adjacent signal wire pair included in the bridge fault list and a bridge fault type. Concretely speaking, an ATPG 151 provided in the test generating module 15 generates such a test pattern by which the bridge fault type determined as to the bridge fault in each of the adjacent signal wire pair is considered. Since the bridge fault type is utilized which is determined by the relationship between the short voltage and the logical threshold value of the input of the receiving cell, such a test pattern capable of detecting the bridge fault propagated in the LSI in high precision is generated.

Also, an auxiliary fault simulation may be carried out with respect to a bridge fault of a circuit portion which can not be determined to be detected or not by the ATPG 151 in the subject LSI. The ATPG 151 judges as to whether or not the bridge fault in each of the adjacent signal wire pairs included in the bridge fault list can be detected by the test pattern so as to generate fault detection information. The fault detection information includes a bridge fault type of each of the bridge faults. Further, the test generating module 15 generates an execution result report. The execution result report includes an execution log of a test pattern generating and fault simulation operation, a test pattern number, a total fault coverage and a fault coverage for each of bridge fault types which are acquired by the ATPG and fault simulation, a detected fault number, an undetected fault number, a redundant fault number, and the like. The term "redundant fault" will be explained later.

It is preferable that the test generating module 15 owns the following function: That is, when any one of the bridge fault types by each of the adjacent signal wire pairs is detected, other bridge fault types by the same adjacent signal wire pair are handled as the detected bridge fault types in response to the detection credibility thereof. As a result, the bridge fault (types) which should be checked as the ATPC subjects are effectively reduced in connection with the progress of the ATPG, so that while the high detection credibility is maintained, the effective test pattern can be generated by a shorter CPU time.

Also, it is preferable that the test generating module 15 owns a multiple detection function. The term "multiple detection function" implies such a function that such test patterns aregenerated, while these test patterns are to detect a bridge fault occurred in the same adjacent wire pair multiple times. For example, in the case that bridge faults with respect to the same adjacent wire pair are detected "N" times, probability at which the bridge faults in this adjacent signal wire pair is detected in an actual bridge fault detection test of the subject LSI is given as follows:

$$[1-\{1-(\text{detection credibility } T_{DT} \text{ in each pattern})\}^N].$$

In other words, when the detection time "N" becomes large, the possibility at which the bridge fault is detected by the bridge fault test becomes high. Also, if the detection credibility $T_{DT}$ in one pattern becomes high, then the bridge fault can be detected in a small number of detection times.

In this case, it is so assumed that detection credibility of "p" pieces of bridge faults (namely, detection credibility for unifying detection credibility of respective bridge fault types) which are detected as "detected" by the test generating module 15 is "$DT_{DT1}$" to "$DT_{DTp}$", and detection times of bridge faults are "N1" to "Np" (note that symbol "p" is natural number). The calculating module 16 calculates a fault coverage "FC" of a test pattern weighted by detection credibility by employing the below-mentioned formula (2):

$$FC=\Sigma_k\{1-(1-DT_{DTk})^{Nk}\}/(AD-DD) \quad (2)$$

In the above formula (2), symbol "$\Sigma_k$" indicates a summation from k=1 up to p; symbol "AD" shows a total number of bridge faults included in the bridge fault list; and symbol "DD" represents a number of redundant faults. Furthermore, the calculating module 16 may calculate a fault coverage "FC_WL" shown in a formula (3) of a test pattern which is weighted by the detection credibility and the adjacent signal wire length, while considering an adjacent signal wire length "$WL_p$" as the weight in the formula (2):

$$FC\_WL=\Sigma_k WL_k\{1-(1-DT_{DTk})^{Nk}\}/(AD\_WL-DD\_WL) \quad (3)$$

In the above formula (3) symbol "AD_WL" represents a total wire length of bridge faults included in the bridge fault list, and symbol "DD_WL" shows a total wire length of the redundant faults. In general, a bridge fault incidence is directly proportional to an adjacent wire length. It is conceivable that the formula (3) may provide a quality metric in high precision, which has a strong correlative relationship with an actual bridge fault incidence.

Figure 16:
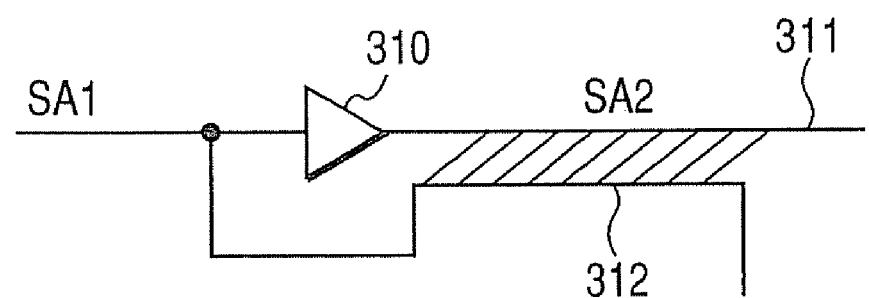
FIG. 16 is a circuit diagram for schematically indicating an example as to a redundant bridge fault.
Figure 17:
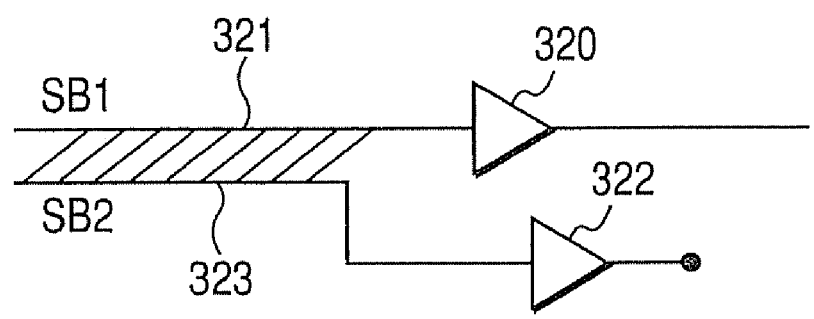
FIG. 17 is a circuit diagram for schematically indicating another example as to a redundant bridge fault.

An example as to redundant faults in bridge faults is shown in hatched line portions of FIG. 16 and FIG. 17. FIG. 16 shows a wire 311 and a wire 312, through which a signal SA1 and an output signal sA2 of a buffer circuit 310 are propagated, while the buffer circuit 310 transfers the signal SA1 without level conversion. Since the signal SA1 and the signal SA2 always have the same level values, the bridge fault between the wire 311 and the wire 312 cannot be detected.

FIG. 17 shows both a wire 321 through which a signal SB1 entered to a buffer circuit 320 is propagated, and a wire 323 through which a signal SB2 entered to a buffer circuit 322 is propagated. An output signal of the buffer circuit 322 is not propagated to another circuit, but also is not outputted outside the LSI. As a result, when there is only such a possibility that an error signal of a bridge fault occurred between the wire 321 and the wire 323 is propagated via the buffer circuit 322, the bridge fault between the wire 321 and the wire 323 cannot be detected.

Figure 18:
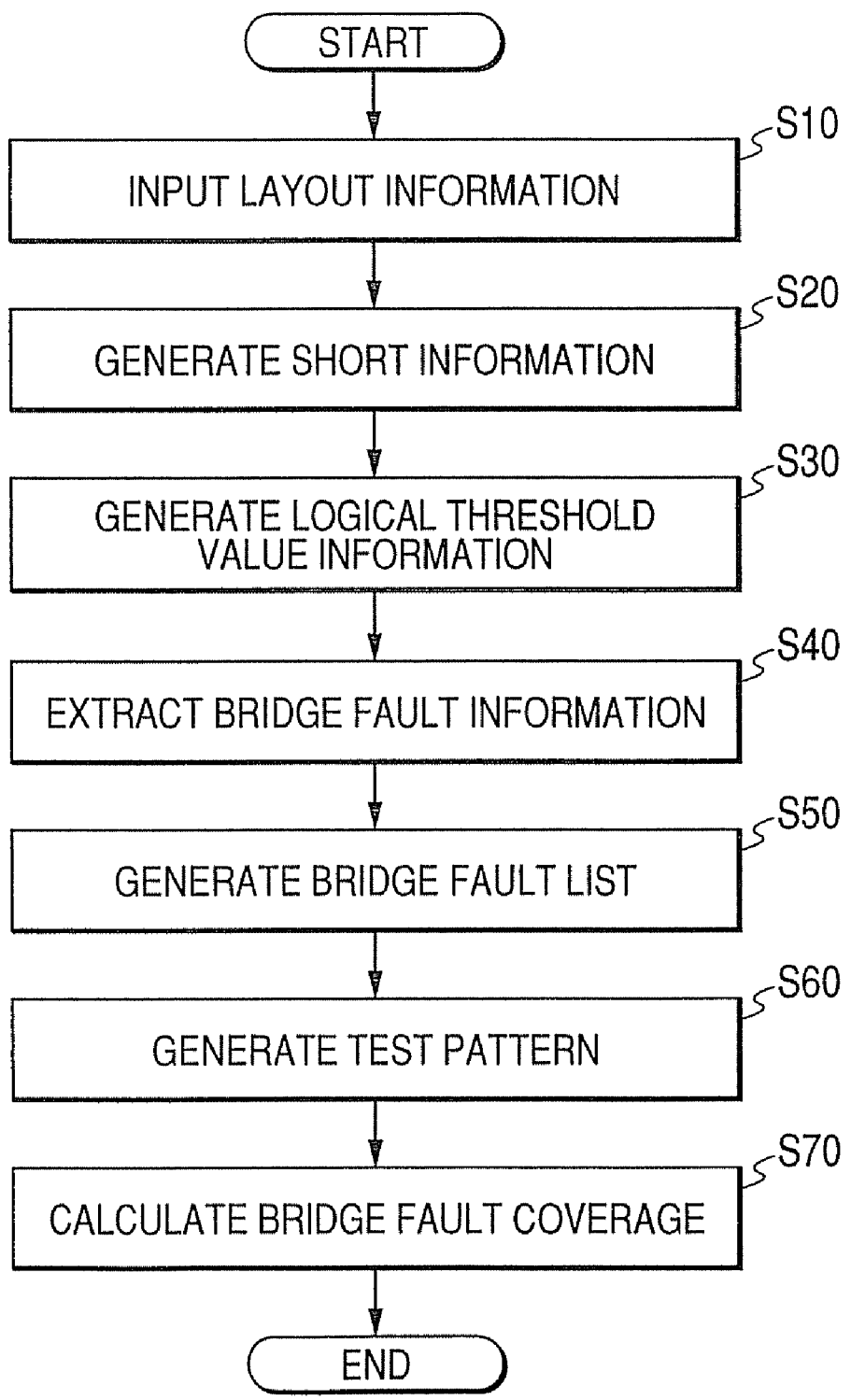
FIG. 18 is a flow chart for explaining a fault list and test pattern generating method according to the first embodiment.

Referring now to a flow chart shown in FIG. 18, a description is made of a method for generating a bridge fault detection-purpose test pattern applied to the subject LSI by the fault test and test pattern generating apparatus 1 shown in FIG. 1.

(1) In a step S10, layout information of the subject LSI is stored via the input apparatus 30 shown in FIG. 1 in the layout information area 201. Also, a preset adjacent wire space is stored in the adjacent wire space area 202.

(2) In a step S20, the short information generating module 11 generates short information by way of the method explained by using the flow chart of FIG. 3. That is, a short voltage and the like at the shorted portion assumed between the cell outputs by employing the circuit-level description of the primitive cells, and the circuit simulation-purpose detailed behavior models of the transistors used in the circuit-level description are calculated, and then, are stored in the short information library S1.

(3) In a step S30, the threshold value information generating module 12 executes the circuit simulation so as to generate logical threshold value information as to the cell stored in the simulation data area 203. The generated logical threshold value information is stored in the threshold value information library 52

(4) In a step S40, the extracting module 13 reads the layout information and the adjacent wire space from the layout information area 201 and the adjacent space area 202 respectively. The extracting module 13 extracts bridge fault information related to such an adjacent signal wire pair that a wire-to-wire space is shorter than, or equal to the adjacent space from a plurality of wire pairs included in the layout information. As previously explained, there are some possibilities that the bridge fault information includes the signal pair information, the adjacent wire length, and the driving cell information, which correspond to the adjacent signal wire pair, and further includes that receiving cell information. The extracted bridge fault information is stored in the bridge fault information area 205.

(5) In a step S50, the fault list generating module 14 reads the short information, the logical threshold value information, and the bridge fault information from the short information library 51, the threshold value information library 52, and the bridge fault information area 205, respectively, so as to generate a bridge fault list. As previously explained, there are some possibilities that the bridge fault list includes the signal pair information, the adjacent signal wire length, the driving cell information, the bridge fault type, the occurrence probability, the propagation probability, the detection credibility, and the like. Further, the receiving cell information may be included. The generated bridge fault list is stored in the fault list area 206.

(6) In a step S60, the test generating module 15 reads the bridge fault list from the fault list area 206. The ATPG 151 provided in the test generating module 15 generates such a test pattern and fault detection information by which a bridge fault in the adjacent signal wire pair included in the bridge fault list is detected. The test generating module 15 generates a test pattern, while a bridge fault type determined as to each of the adjacent signal wire pair is considered. The test pattern is stored in the test pattern area 207. The ATPG 151 may alternatively executes the auxiliary fault simulation so as to calculate a fault coverage of bridge faults in the circuit portion which should not be processed by the ATPG 151, and to generate fault detection information. The fault detection information is stored in the fault detection information area 208. In addition, the test generating module 15 generates an execution result report. The execution result report is stored in the result report area 209.

(7) In a step S70, the calculating module 16 reads the bridges fault list and the fault detection information from the fault list area 206 and the fault detection information 208. The calculating module 16 calculates a fault coverage FC of a test pattern by employing the formula (2). Furthermore, the calculating module 16 calculates a fault coverage FC_WL of the test pattern by employing the formula (3). The fault coverages FC and FC_WL are stored in the fault coverage area 210.

In the related technique, a judgement is made as to whether or not a bridge fault in an adjacent signal wire pair is detected by a test pattern based upon only connection information of a circuit. As a result, there are some possibilities that the detected bridge fault is not such a bridge fault which is propagated and actually detected. In other words, the test pattern cannot be evaluated in high precision.

On the other hand, in the fault list and test pattern generating apparatus according to the first embodiment of the present invention, both the short voltage and the logical threshold value of the receiving terminal (input terminal of the receiving cell) are acquired by the circuit simulation so as to determined the bridge fault type of the bridge fault occurred in the adjacent signal wire pair. Then, the test pattern for detecting the bridge fault which can be propagated via the receiving cell within the LSI is generated by employing the bridge fault type determined as to the adjacent signal wire pair. Furthermore, the fault coverage is calculated which is weighted by the detection credibility of the test pattern and the adjacent signal wire length. As a consequence, both the fault coverage and the bridge fault incidence in the shipping test for the actual product can be calculated in high precision.

Second Embodiment

Figure 19:
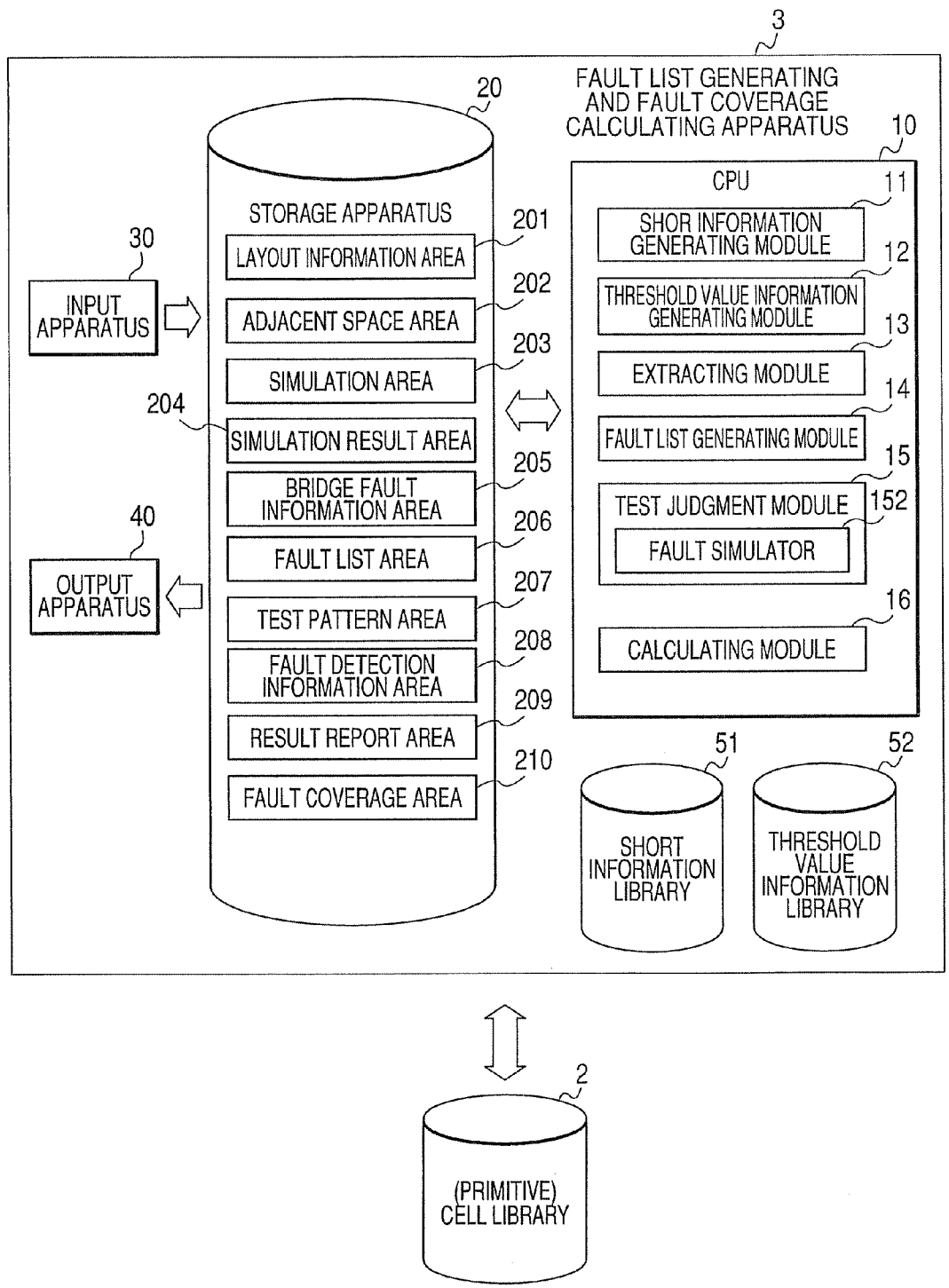
FIG. 19 is a diagram for schematically showing an arrangement of a fault list generating and fault coverage calculating apparatus according to a second embodiment of the present invention.

As shown in FIG. 19, a fault list generating and fault coverage calculating apparatus 3 according to a second embodiment of the present invention owns the following different point from the fault list and test pattern generating apparatus 1 indicated in FIG. 1. That is, the test module 15 is equipped with a fault simulator 152 instead of the ATPG 151. Other arrangements of the second embodiment are similar to those of the first embodiment shown in FIG. 1.

In the fault list and test pattern generating apparatus 1 shown in FIG. 1, the ATPG 151 generates the test pattern for detecting the bridge fault, and the calculating module 16 calculates the fault coverage which is weighted by the credibility of the generated test pattern.

Figure 20:
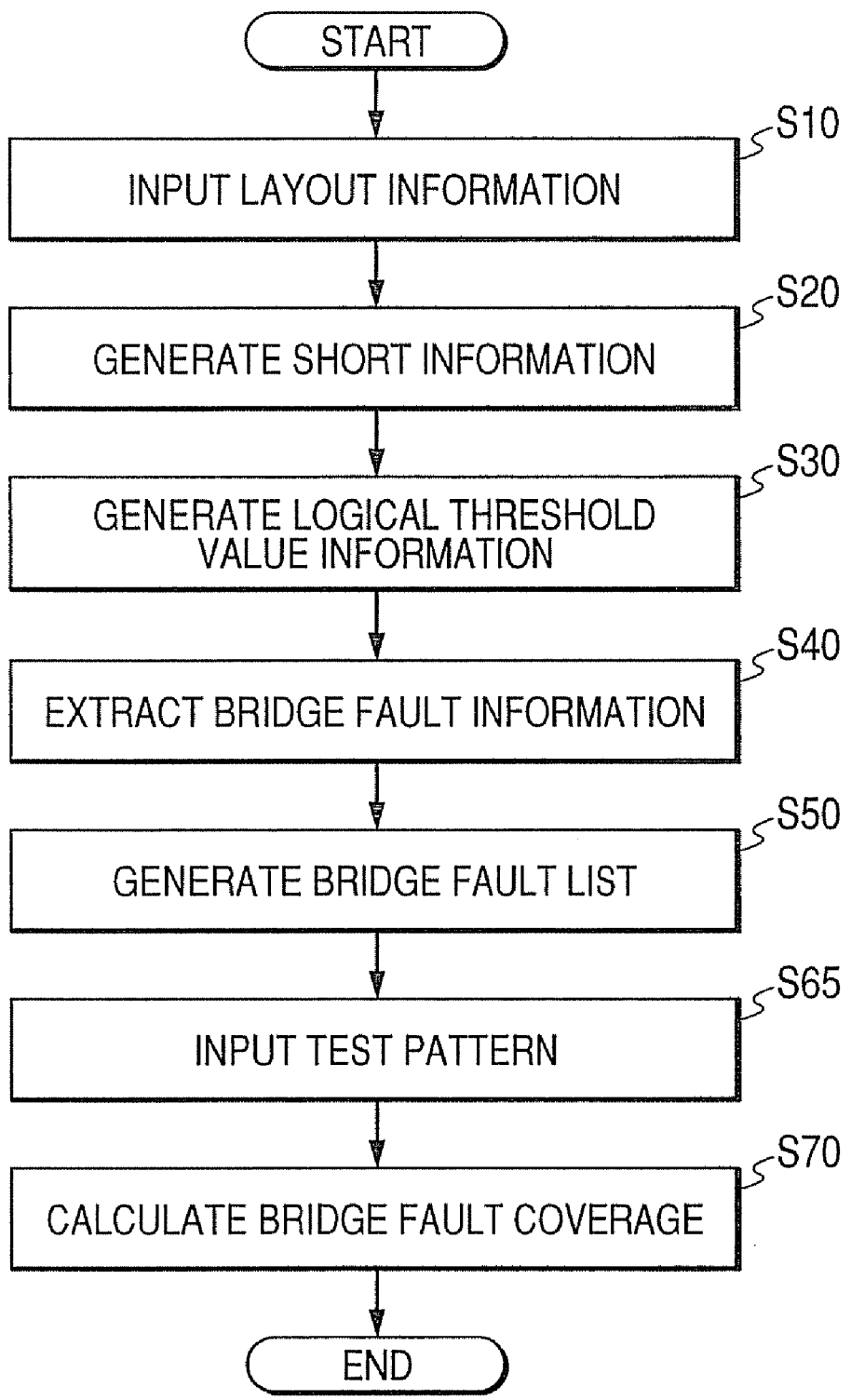
FIG. 20 is a flow chart for explaining a fault list generating and fault coverage calculating method according to the second embodiment.

On the other hand, in the fault list generating and fault coverage calculating apparatus 3 shown in FIG. 19, the test module 15 calculates a fault coverage of a previously generated test pattern. A method for calculating the fault coverage of the test pattern by the fault list generating and fault coverage calculating apparatus 3 indicated in FIG. 19 will now be explained with reference to a flow chart shown in FIG. 20.

(1) In a step S10 to a step S50, short information, logical threshold value information, and a bridge fault list are generated in a similar manner to the method as explained in the step S10 to the step S50 of the flow chart shown in FIG. 18.

(2) In a step S65, the previously generated test pattern which should be detected for the bridge fault is stored via the input apparatus 30 into the test pattern area 207. Then, the failure simulator 152 executes the fault simulation to judge as to whether or not a bridge fault in each of the adjacent signal wire pairs included in the bridge fault list can be detected by the test pattern based upon both the connection information of the subject LSI and the bridge fault type, and then generates fault detection information. Further, the test modulate 15 generates an execution result report.

(3) In a step S70, the calculating module 16 calculates fault coverages FC and FC_WL of the test pattern by employing the formulae (2) and (3) in a similar manner to the method as explained in the step S70 of the flow chart shown in FIG. 18. In other words, the calculating module 16 calculates a fault coverage of the test pattern which is weighted by the detection credibility and the adjacent signal wire length by employing both the fault detection information and the bridge fault list read out from the fault detection information area 202 and the fault list area 206 respectively.

In accordance with the fault list generating and fault coverage calculating apparatus 3 shown in FIG. 19, as to the previously generated test pattern, the fault coverage can be evaluated in high precision by considering as to whether or not the bridge fault propagated in the LSI can be actually detected. Since other effects of the second embodiment are similar to those of the first embodiment 1, duplicated descriptions are omitted.

Other Embodiment Modes

As previously described, while the present invention has been described based upon the first and second embodiments, it should be understood that the descriptions and the drawings which constitute a part of this disclosure do not restrict the present invention. From this disclosure, various sorts of substituted embodiments, embodiments, and operating techniques may be apparent by those skilled in the art.

In the previously explained descriptions of the first and second embodiments, the following examples have been exemplified. That is, the test pattern is generated and the fault coverages FC and FC_WL are calculated by employing the same bridge fault list. Alternatively, such a bridge fault list readable by the ATPG 151 may be generated, while this bridge fault list may include information as to bridge fault types and detection credibility irrespective of the bridge fault list which is utilized to calculate the fault coverages FC and FC_WL.

According to the above-embodiments, the fault list and test pattern generating apparatus, the fault list and test pattern generating method, the fault list generating and fault coverage calculating apparatus, and the fault list generating and fault coverage calculating method are capable of generating such a test pattern for detecting the bridge fault of the LSI in high precision.

As previously explained, the present invention may apparently include various sorts of embodiments which are not described in this specification. Accordingly, the technical scope of the present invention may be defined based upon only the specific items of the present invention related to the proper scope of the claims for a patent.

What is claimed is:

1. A fault list and test pattern generating apparatus comprising:
a short information generating module configured to generate an electrical short information representative of a relationship between logical values of input signals of a plurality of (primitive) cells and a voltage at a shorted portion assumed at outputs of the plurality of (primitive) cells;

a threshold value information generating module configured to calculate logical threshold values of input terminals of the plurality of (primitive) cells so as to generate a logical threshold value information;

an extracting module configured to extract from a layout information of a semiconductor integrated circuit a bridge fault information including a signal information of a pair of adjacent signal wires within a predetermined adjacent space; a wire length of the pair of adjacent signal wires; an information as to driving cells included in the plurality of cells and driving the pair of adjacent signal wires, and an information of receiving cells included in the plurality of cells, and to which signals on the pair of adjacent signal wires is inputted;

a fault list generating module configured to generate, based on the bridge fault information, the electrical short information and the logical threshold value information related to the driving cells and the receiving cells, respectively, a bridge fault list including a bridge fault type determined by a relationship between the voltage values at the shorted portion and the logical threshold values of the input terminals of the receiving cells; and a test generating module configured to generate, based on the bridge fault list, a test pattern that detects bridge faults in the pair of adjacent signal wires.

2. The fault list and test pattern generating apparatus according to claim 1, wherein the predetermined adjacent wire space is set as a adjacent wire-to-line space where a bridge fault incidence becomes higher than, or equal to pre-determined probability based upon a distribution of a bridge fault incidence with respect to the adjacent wire-to-wire space.

3. The fault list and test pattern generating apparatus according to claim 1, wherein the predetermined adjacent wire space is set based on a minimum wire-to-wire space of the semiconductor integrated circuit.

4. The fault list and test pattern generating apparatus according to claim 1, wherein the predetermined adjacent space is set based upon a size distribution information of dusts on a wafer, which is detected in a process applied to a manufacturing of the semiconductor integrated circuit.

5. The fault list and test pattern generating apparatus according to claim 1, wherein the logical values of input signals of the plurality of cells are classified in view of load driving forces of output signals of the plurality of cells.

6. A fault list and test pattern generating apparatus as claimed in claim 1, further comprising:

a calculating module configured to calculate a detection credibility at which the bridge fault detected by the test pattern is actually propagated in the semiconductor integrated circuit to an output terminal of the semiconductor integrated circuit to be detected and a fault coverage of the test pattern weighted by the wire length.

7. A fault list and test pattern generating method, comprising:

generating an electrical short information representative of a relationship between logical values of input signals of a plurality of (primitive) cells and voltage values at a shorted portion assumed at outputs of the plurality of (primitive) cells;

calculating logical threshold values of the input terminals of the plurality of (primitive) cells so as to generate a logical threshold value information;

extracting, from a layout information of a semiconductor integrated circuit, a bridge fault information including a signal information of a pair of adjacent signal wires within a predetermined adjacent space, a wire length of the pair of adjacent signal wires, an information as to driving cells for driving the pair of adjacent signal wires which included in the plurality of cells, and an information of receiving cells to which signals on the adjacent signal wire pair are inputted and which is included in the plurality of cells;

generating, based on the bridge fault information, the read electrical short information and the read logical threshold value information related to the driving cells and the receiving cells, respectively, a bridge fault list including a bridge fault type determined by a relationship between the voltage at the shorted portion and the logical threshold values of the input terminals of the receiving cells; and generating, based on the bridge fault list, a test pattern which detects a bridge fault in the pair of adjacent wires and the bridge fault type.

8. The fault list and test pattern generating method according to claim 7, wherein the predetermined adjacent space is set as a wire-to-wire space where a bridge fault incidence becomes higher than, or equal to pre-determined probability based upon a distribution of a bridge fault incidence with respect to the wire-to-wire space.

9. The fault list and test pattern generating method according to claim 7, wherein the predetermined adjacent space is set based on a minimum wire-to-wire space of the semiconductor integrated circuit.

10. The fault list and test pattern generating method according to claim 7, wherein the predetermined adjacent space is set based upon a size distribution information of dusts on a wafer, which is detected in a process applied to a manufacturing of the semiconductor integrated circuit.

11. The fault list and test pattern generating method according to claim 7, wherein the logical values of input signals of the plurality of cells are classified in view of load driving forces of output signals of the plurality of cells.

12. A fault list generating and fault coverage calculating apparatus comprising:

a short information generating module configured to generate a short information representative of a relationship between logical values of input signals of a plurality of cells and a voltage at a shorted portion assumed at output terminals of the plurality of cells;

a threshold value information generating module configured to calculate logical threshold values of input terminals of the plurality of cells so as to generate a logical threshold value information;

an extracting module configured to extract from a layout information of a semiconductor integrated circuit a bridge fault information including a signal information of an pair of adjacent signal wires within a predetermined adjacent space; a wire length of the pair of adjacent signal wires; an information as to driving cells included in the plurality of cells and driving the pair of adjacent signal wires, and an information of receiving cells included in the plurality of cells, and to which a signal propagated through the pair of adjacent signal wires are inputted;

a fault list generating module configured to calculate, based on the bridge fault information, the short information and the logical threshold value information related to the driving cells and the receiving cells, respectively, a detection credibility at which a bridge fault in the pair of adjacent signal wires included in a bridge fault list can be propagated to the output of the receiving cell, and configured to generate the bridge fault list including the detection credibility;

a test module configured to judge as to whether or not the bridge fault in the pair of adjacent signal wires included in the bridge fault list can be detected by a test pattern that calculates the detection credibility so as to generate fault detection information; and a calculating module configured to calculate, based on the fault detection information and the bridge fault list, a fault coverage of the test pattern which is weighted based upon the detection credibility and the wire length.

13. The fault list generating and fault coverage calculating apparatus according to claim 12, wherein the predetermined adjacent space is set as a wire-to-wire space where a bridge fault incidence becomes higher than, or equal to constant probability based upon a distribution of a bridge fault incidence with respect to the adjacent wire-to-wire space.

14. The fault list generating and fault coverage calculating apparatus according to claim 12, wherein the predetermined adjacent space is set based on a minimum wire-to-wire space of the semiconductor integrated circuit.

15. The fault list generating and fault coverage calculating apparatus according to claim 12, wherein the predetermined adjacent space is set based upon a size distribution information of dusts on a wafer, which is detected in a process applied to a manufacturing of the semiconductor integrated circuit.

16. The fault list generating and fault coverage calculating apparatus according to claim 12, wherein the logical values of input signals of the plurality of cells are classified in view of load driving forces of output signals of the plurality of cells.

17. A fault list generating and fault coverage calculating method, comprising:

generating a short information representative of a relationship between logical values of input signals of a plurality of cells and a voltage at an electrically shorted portion assumed at output terminals of the plurality of cells;

calculating logical threshold values of input terminals of the plurality of cells so as to generate a logical threshold value information;

extracting, from layout information of a semiconductor integrated circuit, a bridge fault information including a signal information of a pair of adjacent signal wires within a predetermined adjacent space, a wire length of the pair of adjacent signal wires, an information as to driving cells for driving the pair of adjacent signal wires which are included in the plural cells, and an information of receiving cells to which a signal propagated through the adjacent signal wire pair are inputted, and which are included in the plural cells;

calculating, based on the bridge fault information, the short information and the logical threshold value information, a detection credibility at which a bridge fault in the pair of adjacent signal wires included in a bridge fault list is propagated within the semiconductor integrated circuit to be detected;

generating the bridge fault list including the detection credibility;

judging as to whether or not the bridge fault in the pair of adjacent signal wires included in the bridge fault list can be detected by a test pattern which calculates the detection credibility so as to generate a fault detection information; and calculating, based on the fault detection information and the bridge fault list, a fault coverage of the test pattern which is weighted based upon the detection credibility and the wire length.

18. The fault list generating and fault coverage calculating method according to claim 17, wherein the predetermined adjacent space is set as a wire-to-wire space where a bridge fault incidence becomes higher than, or equal to constant probability based upon a distribution of a bridge fault incidence with respect to the adjacent wire-to-wire space.

19. The fault list generating and fault coverage calculating method according to claim 17, wherein the predetermined adjacent space is set based on a minimum wire-to-wire space of the semiconductor integrated circuit.

20. The fault list generating and fault coverage calculating method according to claim 17, wherein the logical values of input signals of the plurality of cells are classified in view of load driving forces of output signals of the plurality of cells.

* * * * *